(12) United States Patent
Lyons et al.

(10) Patent No.: US 6,291,137 B1
(45) Date of Patent: Sep. 18, 2001

(54) SIDEWALL FORMATION FOR SIDEWALL PATTERNING OF SUB 100 NM STRUCTURES

(75) Inventors: Christopher F. Lyons, Fremont; Michael K. Templeton, Atherton; Kathleen R. Early, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/234,380

(22) Filed: Jan. 20, 1999

(51) Int. Cl.$^7$ .............. G03C 5/00; H01L 21/31; H01L 21/461
(52) U.S. Cl. ............ 430/313; 430/316; 430/317; 430/318; 438/639; 438/696; 438/706
(58) Field of Search ............... 430/311, 313, 430/314, 316, 317, 318; 438/639, 706, 696, 623, 763

(56) References Cited

U.S. PATENT DOCUMENTS

| | | | |
|---|---|---|---|
| 4,502,914 | * | 3/1985 | Trumpp et al. ............ 438/424 |
| 4,803,181 | * | 2/1989 | Buchmann et al. ......... 438/696 |
| 5,595,941 | | 1/1997 | Okamoto et al. .......... 437/228 |
| 5,665,203 | * | 9/1997 | Lee et al. ................ 438/585 |
| 5,705,321 | | 1/1998 | Brueck et al. ............ 430/316 |
| 5,710,066 | | 1/1998 | Okamoto et al. .......... 437/228 |
| 5,714,039 | | 2/1998 | Beilstein, Jr. et al. .... 156/657.1 |
| 5,895,740 | * | 4/1999 | Chien et al. ............. 430/313 |

* cited by examiner

Primary Examiner—Shean C. Wu
(74) Attorney, Agent, or Firm—Renner, Otto, Boisselle & Sklar, LLP

(57) ABSTRACT

In one embodiment, the present invention relates to a method of forming a conductive structure having a width of about 100 nm or less, involving the steps of providing a substrate having a conductive film; patterning a sidewall template over a first portion of the conductive film wherein a second portion of the conductive film is exposed, the sidewall template having at least one sidewall over the conductive film; depositing a sidewall film over the conductive film and the sidewall template, the sidewall film having a vertical portion adjacent the sidewall of the sidewall template and a horizontal portion in areas not adjacent the sidewall of the sidewall template; removing the horizontal portion of the sidewall film exposing a third portion of the conductive film; removing the sidewall template exposing a fourth portion of the conductive film; and etching the third portion and the fourth portion of the conductive film thereby providing the conductive structure having a width of about 100 nm or less underlying the vertical portion of the sidewall film.

20 Claims, 2 Drawing Sheets

SIDEWALL FORMATION FOR SIDEWALL PATTERNING OF SUB 100 NM STRUCTURES

TECHNICAL FIELD

The present invention generally relates to making sub-lithographic structures using sidewall patterning techniques. In particular, the present invention relates to sub 100 nm conductive structures using sidewall patterning techniques.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 $\mu$m or less with acceptable resolution is difficult at best, and impossible in some circumstances. Patterning conductive features including metal lines and silicon substances (such as amorphous silicon and polysilicon) with small dimensions is required in order to participate in the continuing trend toward higher device densities. Procedures that increase resolution, improved critical dimension control, and provide small conductive features are therefore desired.

SUMMARY OF THE INVENTION

The present invention provides methods of forming sub-lithographic features. The present invention also provides sub-lithographic conductive features that are particularly useful for forming metal lines, gate conductors and interconnects. As a result, the present invention effectively addresses the concerns raised by the trend towards the miniaturization of semiconductor devices.

In one embodiment, the present invention relates to a method of forming a conductive structure having a width of about 100 nm or less, involving the steps of providing a substrate having a conductive film; patterning a sidewall template over a first portion of the conductive film wherein a second portion of the conductive film is exposed, the sidewall template having at least one sidewall over the conductive film; depositing a sidewall film over the conductive film and the sidewall template, the sidewall film having a vertical portion adjacent the sidewall of the sidewall template and a horizontal portion in areas not adjacent the sidewall of the sidewall template; removing the horizontal portion of the sidewall film exposing a third portion of the conductive film; removing the sidewall template exposing a fourth portion of the conductive film; and etching the third portion and the fourth portion of the conductive film thereby providing the conductive structure having a width of about 100 nm or less underlying the vertical portion of the sidewall film.

In another embodiment, the present invention relates to a method of forming a polysilicon structure, involving the steps of providing a substrate having a polysilicon film; patterning a sidewall template over a first portion of the polysilicon film wherein a second portion of the polysilicon film is exposed, the sidewall template having at least one sidewall over the polysilicon film; depositing a silicon containing sidewall film over the polysilicon film and the sidewall template, the silicon containing sidewall film having a vertical portion adjacent the sidewall of the sidewall template and a horizontal portion in areas not adjacent the sidewall of the sidewall template, the silicon containing sidewall film having a thickness from about 100 Å to about 2,000 Å; removing the horizontal portion of the silicon containing sidewall film exposing a third portion of the polysilicon film; removing the sidewall template exposing a fourth portion of the polysilicon film; and etching the third portion and the fourth portion of the polysilicon film thereby providing the polysilicon structure having a width of about 100 nm or less underlying the vertical portion of the silicon containing sidewall film.

In yet another embodiment, the present invention relates to a method of forming a thin metal line, involving the steps of providing a substrate having a metal layer thereon patterning a sidewall template over a first portion of the metal layer wherein a second portion of the metal layer is exposed, the sidewall template having at least one sidewall over the metal layer; depositing a silicon containing sidewall film over the metal layer and the sidewall template, the silicon containing sidewall film having a vertical portion adjacent the sidewall of the sidewall template and a horizontal portion in areas not adjacent the sidewall of the sidewall template, the silicon containing sidewall film having a thickness from about 100 Å to about 2,000 Å; removing the horizontal portion of the silicon containing sidewall film exposing a third portion of the metal layer; removing the sidewall template exposing a fourth portion of the metal layer; and etching the third portion and the fourth portion of the metal layer thereby providing the thin metal line having a width of about 100 nm or less underlying the vertical portion of the silicon containing sidewall film.

DISCLOSURE OF INVENTION

Figure 1:
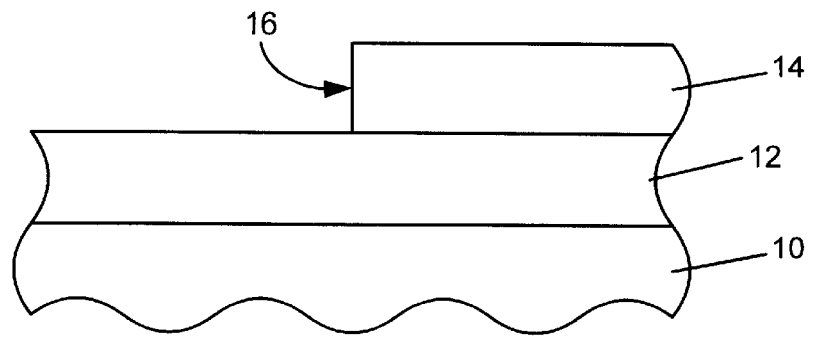
FIG. 1 illustrates in a cross-sectional view the methods of forming a sub-lithographic structure according to several aspects of the present invention.

The present invention involves making sub-lithograph structures by sidewall patterning of a template film. The present invention more specifically involves methods of forming sub-lithographic features in a simple and efficient manner. substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The conductive film is provided over a portion of the substrate or over the entire substrate.

The conductive film contains a material that conducts or semiconducts electrical current. Conductive films include metal layers and silicon layers, such as polysilicon and amorphous silicon. Metal layers include layers of a single metal as well as metal alloy layers containing two or more metals. Specific examples of metal layers include aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, metal silicides, and any other alloys thereof.

The conductive film may be formed in any suitable manner. The thickness of the conductive film is typically from about 300 Å to about 3,000 Å. In another embodiment, the thickness of the conductive film is from about 500 Å to about 2,500 Å. In another embodiment, the thickness of the conductive film is from about 750 Å to about 2,000 Å.

A sidewall template is provided over a portion of the conductive film wherein portions of the conductive film are exposed. The sidewall template is provided over a portion of the conductive film or over the entire conductive film and etched back so that the sidewall template has at least one sidewall substantially perpendicular to the substrate surface. The sidewall template is etched back or patterned using suitable photolithographic techniques. In most embodiments, the sidewall template has two or more sidewalls substantially perpendicular to the substrate surface.

The sidewall template contains a material that may be formed into a pattern.

Examples of sidewall template materials include silicon containing materials, such as silicon oxide, silicon nitride and silicon oxynitride, and low K polymer materials. Low K polymer materials are materials having low dielectric constants and include polyimides, fluorinated polyimides, polysilsequioxane, benzocyclobutene (BCB), parlene F, parlene N and amorphous polytetrafluoroethylene. A specific example of a commercially available low K polymer material is Flare™ from AlliedSignal believed to be derived from perfluorobiphenyl and aromatic bisphenols.

The sidewall template may be made in any suitable manner, including chemical vapor deposition (CVD) techniques (in the case of silicon containing materials) or spin coating (in the case of low K polymer materials. CVD techniques include low pressure chemical vapor deposition (LPCVD) and plasma enhanced chemical vapor deposition (PECVD). In one embodiment, a silicon nitride film may be made by PECVD or LPCVD employing gases containing silicon and nitrogen, such as using $SiH_4$ or $SiCl_2H_2$ and $N_2$ or $NH_3$. In another embodiment, a silicon oxide film may be made by PECVD or LPCVD employing gases containing silicon and oxygen, such as using $SiH_4$ or $SiCl_2H_2$ and $N_2O$ or $O_2$. In yet another embodiment, a silicon oxynitride film may be made by PECVD or LPCVD employing gases containing silicon, oxygen and nitrogen, such as using $SiH_4$ and $N_2O$ and $NH_3$.

The thickness of the sidewall template is selected so that a vertical portion of the sidewall film (described later) is large enough to effectively act as a conductive film mask. In one embodiment, the sidewall template has a thickness from about 500 Å to about 10,000 Å. In another embodiment, the sidewall template has a thickness from about 1,000 Å to about 5,000 Å. In yet another embodiment, the sidewall template has a thickness from about 1,500 Å to about 3,000 Å.

A sidewall film is deposited over all or a portion of the conductive film partially covered by the sidewall template. In a preferred embodiment, the sidewall film is deposited over the entire substrate. The sidewall film conforms to the profile of the conductive film partially covered by the sidewall template; that is, the sidewall film is formed in a substantially uniform thickness over the conductive film or sidewall template.

The sidewall film is selected so that there is etch selectivity between the conductive film, the sidewall template and the sidewall film. For conductive films of metal layers and silicon layers, sidewall films of one or more of silicon oxide, silicon oxynitride and silicon nitride are employed. In these embodiments, the sidewall film contains a silicon containing film. Although the sidewall template may, in some embodiments, contain a silicon containing film, the sidewall template and the sidewall film are made of different materials. The sidewall film may be made in any suitable manner, including CVD techniques described above.

In embodiments where the conductive film is a metal, such as those listed above including aluminum, copper, titanium and tungsten, the sidewall film is preferably silicon oxide or silicon nitride, although silicon oxynitride may be employed as the sidewall film. In embodiments where the conductive film is a silicon layer such as polysilicon or amorphous silicon, the sidewall film is preferably silicon nitride or silicon oxynitride, although silicon oxide may be employed as the sidewall film.

The thickness of the sidewall film is selected depending upon the desired width of the resultant sub-lithographic conductive structure. In one embodiment, the sidewall film has a thickness from about 100 Å to about 2,000 Å. In another embodiment, the sidewall film has a thickness from about 200 Å to about 1,500 Å. In yet another embodiment, the sidewall film has a thickness from about 300 Å to about 1,000 Å. In one embodiment, the thickness of the sidewall film is substantially uniform around the conductive film and sidewall template in that the thickness does not vary by more than about 50 Å comparing the thickest and thinnest areas of the sidewall film.

For purposes of this invention, there are two main portions of the sidewall film. The first is a portion of the sidewall film adjacent the sidewall(s) of the sidewall template and is referred to herein as the vertical portion. The second is a portion of the sidewall film that covers the flat surfaces (parallel or substantially parallel to the plane of the flat surface of the substrate) of the sidewall template and the conductive film and is referred to herein as the horizontal portion(s).

A directional etch is performed to remove portions of the sidewall film covering the flat surfaces of the sidewall template and conductive film (the horizontal portions as defined above) while not substantially removing the vertical portion of the sidewall film adjacent the sidewalls of the sidewall template. Dry or wet etching techniques may be employed. In a preferred embodiment, a dry anisotropic etch process is employed whereby the horizontal portions of the sidewall film are removed. In one embodiment, a RIE technique is employed. In a preferred embodiment, dry etch techniques are used. The specific etchant depends upon the specific identity of the sidewall film material. Dry etch techniques typically involve using a plasma containing one or more fluorine compounds, such as one of $NF_3$, $SF_6$, $CH_3F$, $C_4F_8$, $CF_4$ and $CHF_3$. The etch technique is selected so that the sidewall template and conductive film are not etched significantly etched or degraded. In this connection, the sidewall template and conductive film act as etch stop layers when performing the directional etch of the sidewall film.

While the directional etch removes the horizontal portions of the sidewall film, a small amount of the vertical portion of the sidewall film may be also removed. However, in most instances, the small amount of the vertical portion removed substantially corresponds with the thickness of the sidewall film thus leaving a vertical portion of the sidewall film (having a height) equal to or slightly less than the height of the thickness of the sidewall template). Typically, the height of the vertical portion of the sidewall film is slightly less (from about 1% to about 20% less based upon the height of the step) than the height of the sidewall template. All or substantially all (from about 80% to about 99% of the original height) of the vertical portion of the sidewall film remains positioned adjacent the sidewall template.

After directional etch of the horizontal portions of the sidewall film, the sidewall template is removed or stripped. Dry or wet etching techniques may be employed. In a one embodiment, a dry anisotropic etch process is employed to remove the sidewall template. In one embodiment, a RIE technique is employed. In a preferred embodiment, dry etch techniques are used. In another embodiment, wet etch techniques using an acid, such as hydrofluoric acid or phosphoric acid are employed. The specific etchant depends upon the specific identity of the sidewall template material. Dry etch techniques typically involve using a plasma containing one or more fluorine compounds, such as one of $NF_3$, $SF_6$, $CH_3F$, $C_4F_8$, $CF_4$ and $CHF_3$ when the sidewall template is a silicon containing material or an oxygen containing compound, such as $O_2$, when the sidewall template is a low K polymer material. The etch technique is selected so that the vertical portion of the sidewall film and the conductive film are not etched significantly etched or degraded. In this connection, the conductive film acts an as etch stop layer when performing the directional etch of the sidewall template.

The exposed portions of the conductive film are etched in a directional manner wherein the remaining vertical portion of the sidewall film acts as a mask for conductive film located underneath it. In one embodiment, the exposed portions of the conductive film are etched using an anisotropic etching process. In another preferred embodiment, a RIE is employed. Dry or wet etching techniques may be employed. In a preferred embodiment, dry etch techniques are used. The specific etchant depends upon the specific identity of the conductive film material. Dry etch techniques typically involve using a plasma containing fluorine or chlorine compounds, such as one or more of $BCl_3$, $CCl_4$, $SiCl_4$, $Cl_2$, $NF_3$, $SF_6$, $CH_3F$, $CF_4$ and $CHF_3$. The etch technique is selected so that the vertical portion of the sidewall film or the underlying substrate is not etched or significantly etched or degraded.

Generally speaking, the etch techniques for the directional etch of the horizontal portions of the sidewall film, the removal of the sidewall template (if etch techniques are used) and the etch of the conductive film are selected so that at least about 2:1 etch selectivity is achieved between the one material and the other material(s). In a preferred embodiment, the etch techniques for the directional etch of the horizontal portions of the sidewall film, the removal of the sidewall template (if etch techniques are used) and the etch of the conductive film are selected so that at least about 3:1 etch selectivity is achieved between the one material and the other material(s). In a more preferred embodiment, the etch techniques for the directional etch of the horizontal portions of the sidewall film, the removal of the sidewall template (if etch techniques are used) and the etch of the conductive film are selected so that at least about 5:1 etch selectivity is achieved between the one material and the other material(s).

Remaining on the substrate is one or more lines (depending upon the shape of the patterning of the sidewall template) of the conductive film underneath the vertical portions of the sidewall film constituting a sub-lithographic structure or feature. Alternatively, the remaining vertical portion of the sidewall film may be stripped or removed leaving a su-lithographic structure or feature made of the conductive film material.

The dimensions of the conductive film portion of the resulting sub-lithographic feature depend primarily upon the specific identity of the sidewall film material and the thickness of the sidewall film. The dimensions of the conductive film portion of the resulting sub-lithographic feature may be from about 100 Å to about 2,000 Å in width and from about 300 Å to about 3,000 Å in height. In another embodiment, the dimensions of the conductive film portion of the resulting sub-lithographic feature may be from about 200 Å to about 1,500 Å in width and from about 500 Å to about 2,500 Å in height. In yet another embodiment, the dimensions of the conductive film portion of the resulting sub-lithographic feature may be from about 300 Å to about 1,000 Å in width and from about 750 Å to about 2,000 Å in height.

The resulting sub-lithographic feature made in accordance with the present invention may be useful for subsequent processing of the substrate on which it is positioned. For example, the sub-lithographic feature made in accordance with the present invention may be used for forming a gate conductor (in embodiments where the conductive film contains silicon) and/or for forming thin metal lines.

One embodiment of the methods of the present invention is now described in connection with the Figures. Referring to FIG. 1, a substrate 10 is provided with a conductive film 12 over a portion of the substrate 10. Although not shown, the substrate 10 may include any suitable semiconductor material (one or more layers of semiconductor materials), for example, a monocrystalline silicon substrate. Also, although not shown, the substrate 10 may include one or more layers including substrate layers, diffusion regions, dielectric layers such as oxides, devices, polysilicon layers, and the like.

The conductive film 12 may be deposited over the entire substrate 10 and patterned to cover a desired portion of the substrate 10 using, for instance, photolithography and etching techniques. In this embodiment, the conductive film 12 comprises polysilicon. The thickness of the polysilicon conductive film 12 is about 2,000 Å. A silicon oxide template 14 is deposited and patterned over the polysilicon conductive film 12 using suitable photolithography techniques so that it partially covers the polysilicon conductive film 12, wherein a portion of the conductive film 12 is exposed (not underneath the silicon oxide template 14). The silicon oxide template 14 is patterned in such a manner that there is at least one sidewall 16 in the silicon oxide template 14 over the substrate. The thickness of the silicon oxide template 14 is about 3,000 Å.

Figure 2:
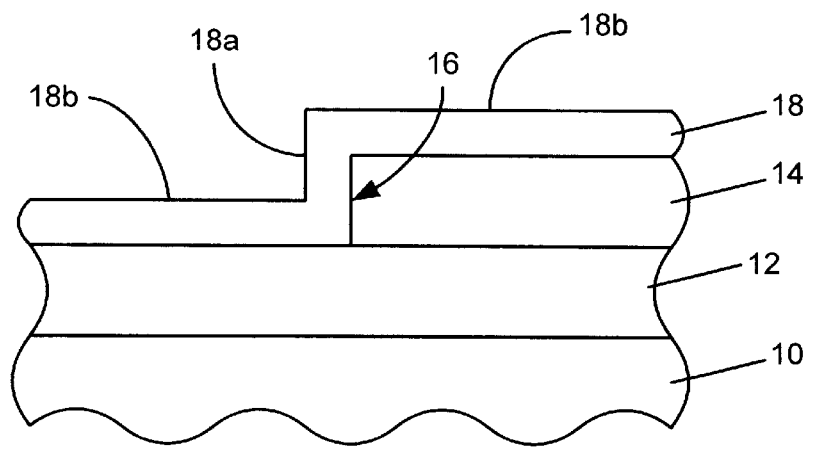
FIG. 2 illustrates in a cross-sectional view the methods of forming a sub-lithographic structure according to several aspects of the present invention.

Referring to FIG. 2, a sidewall film 18 is deposited over the polysilicon conductive film 12 and the silicon oxide template 14 in a suitable manner. In this embodiment, a silicon nitride layer is deposited by CVD techniques and the thickness of the silicon nitride sidewall film 18 is about 750 Å. The thickness of the sidewall film 18 is substantially uniform on the polysilicon conductive film 12 and the silicon oxide template 14. There are two portions of the silicon nitride sidewall film 18; namely, a portion 18a adjacent the sidewall 16 of the silicon oxide template 14 and portions 18b covering the flat surfaces of the conductive film 12 and the silicon oxide template 14.

Figure 3:
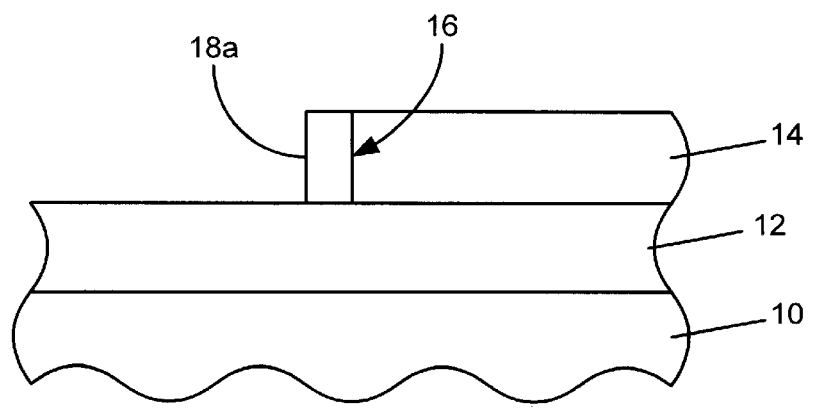
FIG. 3 illustrates in a cross-sectional view the methods of forming a sub-lithographic structure according to several aspects of the present invention.

Referring to FIG. 3, a directional etch is performed removing portions of the sidewall film covering the flat surfaces of the polysilicon conductive film 12 and the silicon oxide template 14. In this embodiment, an anisotropic dry etch using $NF_3$ is performed for a time sufficient to remove the portions 18b of the sidewall film 18 over the flat surfaces of the conductive film 12 and the silicon oxide template 14, but not so long as to remove substantial portion 18a of the sidewall film 18 adjacent the sidewall 16 of the silicon oxide template 14.

Figure 4:
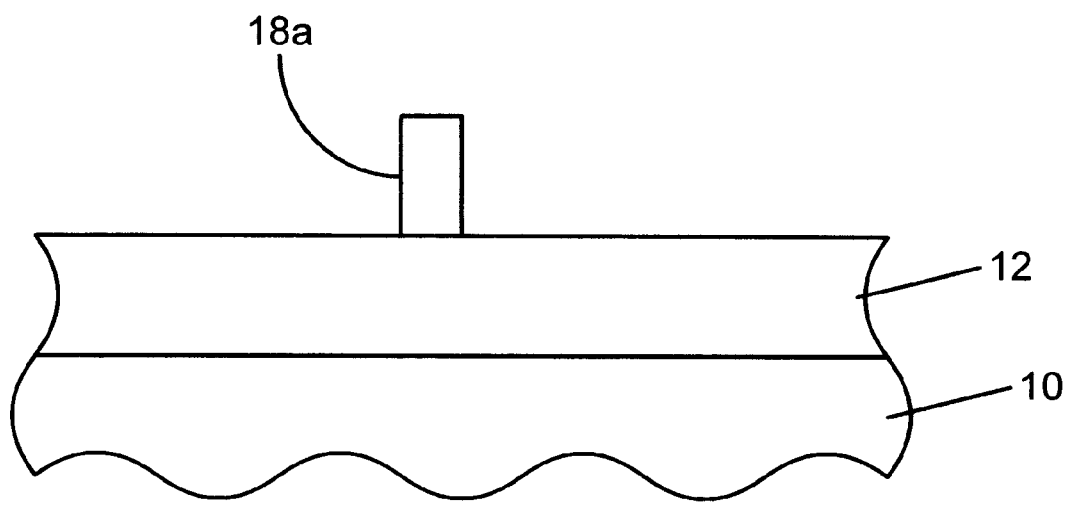
FIG. 4 illustrates in a cross-sectional view the methods of forming a sub-lithographic structure according to several aspects of the present invention.

Referring to FIG. 4, the silicon oxide template 14 is stripped or removed without substantially damaging or removing the remaining portion 18a of the silicon nitride sidewall film 18. In this embodiment, a wet etching technique using hydrofluoric acid is employed. The conductive film 12 is exposed except for portions underneath the silicon nitride sidewall film portion 18a.

Figure 5:
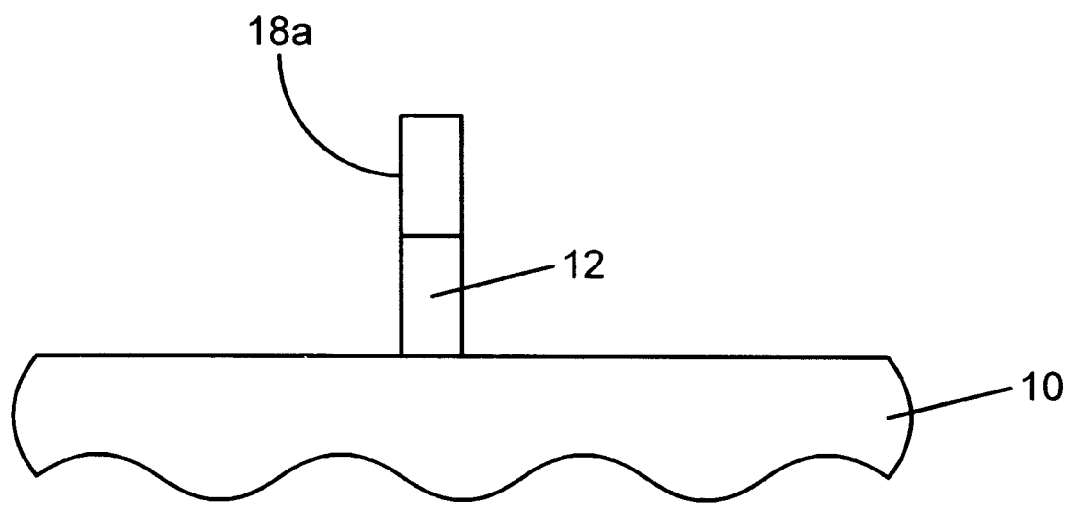
FIG. 5 illustrates in a cross-sectional view the methods of forming a sub-lithographic structure according to several aspects of the present invention.

Referring to FIG. 5, a directional etch is performed removing exposed portions of the conductive film 12 (not underneath the sidewall film portion 18a) by suitable means. For example, a selective etch technique is used to remove the polysilicon conductive film 12 employing an anisotropic dry etch leaving patterned remaining portion 18a of the silicon nitride sidewall film 18. The remaining sidewall film portion 18a serves as a mask to prevent etching or removal of the remaining portion of the polysilicon conductive film 12 there beneath during the directional etch. In this embodiment, a dry etch technique including a fluorocarbon and a chloro compound, such as using $Cl_2$ and $SF_6$, is employed. The etch technique has selectivity in that the size of the remaining portion 18a of the silicon nitride sidewall film 18 is not substantially reduced, although reductions in size may be tolerated.

In this embodiment, the height and width of patterned remaining polysilicon conductive film 12 beneath the remaining portion 18a is about 2,000 Å and about 750 Å. The patterned remaining polysilicon conductive film 12 may be used in making gate conductors. The patterned remaining polysilicon conductive film 12 is particularly useful for forming narrow gate conductors which enables the production of semiconductor devices having high densities.

Another embodiment of the methods of the present invention is now described in connection with the Figures. Referring again to FIG. 1, a substrate 10 is provided with a conductive film 12 over a portion of the substrate 10. Although not shown, the substrate 10 may include any suitable semiconductor material (one or more layers of semiconductor materials), for example, a monocrystalline silicon substrate. Also, although not shown, the substrate 10 may include one or more layers including substrate layers, diffusion regions, dielectric layers such as oxides, devices, polysilicon layers, and the like.

The conductive film 12 may be deposited over the entire substrate 10 and patterned to cover a desired portion of the substrate 10 using, for instance, photolithography and etching techniques. In this embodiment, the conductive film 12 comprises an aluminum-copper alloy. The thickness of the aluminum-copper alloy conductive film 12 is about 1,500 Å. A low K polymer material template 14 is deposited and patterned over the aluminum-copper alloy conductive film 12 using suitable photolithography techniques so that it partially covers the aluminum-copper alloy conductive film 12, wherein a portion of the conductive film 12 is exposed (not underneath the low K polymer material template 14). In this embodiment, the low K polymer material is polyimide. The low K polymer material template 14 is patterned in such a manner that there is at least one sidewall 16 in the low K polymer material template 14 over the substrate. The thickness of the low K polymer material template 14 is about 2,500 Å.

Referring to FIG. 2, a sidewall film 18 is deposited over the aluminum-copper alloy conductive film 12 and the low K polymer material template 14 in a suitable manner. In this embodiment, a silicon oxynitride layer is deposited by CVD techniques and the thickness of the silicon oxynitride sidewall film 18 is about 400 Å. The thickness of the silicon oxynitride sidewall film 18 is substantially uniform on the aluminum-copper alloy conductive film 12 and the low K polymer material template 14. There are two portions of the silicon oxynitride sidewall film 18; namely, a portion 18a adjacent the sidewall 16 of the low K polymer material template 14 and portions 18b covering the flat surfaces of the conductive film 12 and the low K polymer material template 14.

Referring to FIG. 3, a directional etch is performed removing portions of the sidewall film covering the flat surfaces of the aluminum-copper alloy conductive film 12 and the low K polymer material template 14. In this embodiment, an anisotropic dry etch using $C_4F_8$ is performed for a time sufficient to remove the portions 18b of the silicon oxynitride sidewall film 18 over the flat surfaces of the aluminum-copper alloy conductive film 12 and the low K polymer material template 14, but not so long as to remove substantial portions 18a of the silicon oxynitride sidewall film 18 adjacent the sidewall 16 of the low K polymer material template 14.

Referring to FIG. 4, the low K polymer material template 14 is stripped or removed without substantially damaging or removing the remaining portion 18a of the silicon oxynitride sidewall film 18. In this embodiment, a dry etching technique using oxygen containing plasmas, such as $O_2$, is employed. The conductive film 12 is exposed except for portions underneath the silicon oxynitride sidewall film portion 18a.

Referring to FIG. 5, a directional etch is performed removing exposed portions of the aluminum-copper alloy conductive film 12 (not underneath the sidewall film portion 18a) by suitable means. For example, a selective etch technique is used to remove the aluminum copper alloy conductive film 12 employing an anisotropic dry etch leaving patterned remaining portion 18a of the silicon oxynitride sidewall film 18. The remaining portion 18a serves as a mask to prevent etching of the remaining portion of the aluminum-copper alloy conductive film 12 there beneath during the directional etch. In this embodiment, a dry etch technique including at least one chloro compound, such as using $Cl_2$ and $BCl_3$, is employed. The etch technique has selectivity in that the size of the remaining portion 18a of the silicon oxynitride sidewall film 18 is not substantially reduced, although reductions in size may be tolerated.

In this embodiment, the height and width of patterned remaining aluminum-copper alloy conductive film 12 beneath the remaining portion 18a is about 1,500 Å and about 400 Å. The patterned remaining aluminum-copper alloy conductive film 12 may be used in making interconnect lines, particulary narrow interconnect lines which enables the production of semiconductor devices having high densities.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a conductive structure having a width of about 100 nm or less, comprising:

providing a substrate having a conductive film;

patterning a sidewall template over a first portion of the conductive film wherein a second portion of the conductive film is exposed, the sidewall template having at least one sidewall over the conductive film;

depositing a sidewall film over the conductive film and the sidewall template, the sidewall film having a vertical portion adjacent the sidewall of the sidewall template and a horizontal portion in areas not adjacent the sidewall of the sidewall template;

removing the horizontal portion of the sidewall film exposing a third portion of the conductive film, the third portion being at least a part of the second portion;

removing the sidewall template exposing a fourth portion of the conductive film, the fourth portion being at least a part of the first portion; and etching the third portion and the fourth portion of the conductive film thereby providing the conductive structure having a width of about 100 nm or less underlying the vertical portion of the sidewall film.

2. The method of claim 1, wherein the conductive film comprises one of polysilicon, amorphous silicon, aluminum, copper, gold, nickel, palladium, platinum, silver, tantalum, titanium, tungsten, zinc, an aluminum-copper alloy, an aluminum alloy, a copper alloy, a titanium alloy, a tungsten alloy, a titanium-tungsten alloy, a gold alloy, a nickel alloy, a palladium alloy, a platinum alloy, a silver alloy, a tantalum alloy, and a zinc alloy.

3. The method of claim 1, wherein the conductive film has a thickness from about 500 Å to about 3,000 Å.

4. The method of claim 1, wherein the sidewall template has a thickness from about 500 Å to about 10,000 Å.

5. The method of claim 1, wherein the sidewall template comprises at least one of a silicon containing material and a low K polymer material.

6. The method of claim 1, wherein the sidewall film comprises at least one of silicon nitride, silicon oxide, and silicon oxynitride.

7. The method of claim 1, wherein the horizontal portion of the sidewall film is removed using an anisotropic etching technique.

8. A method of forming a polysilicon structure, comprising:

providing a substrate having a polysilicon film;

patterning a sidewall template over a first portion of the polysilicon film wherein a second portion of the polysilicon film is exposed, the sidewall template having at least one sidewall over the polysilicon film;

depositing a silicon containing sidewall film over the polysilicon film and the sidewall template, the silicon containing sidewall film having a vertical portion adjacent the sidewall of the sidewall template and a horizontal portion in areas not adjacent the sidewall of the sidewall template, the silicon containing sidewall film having a thickness from about 100 Å to about 2,000 Å;

removing the horizontal portion of the silicon containing sidewall film exposing a third portion of the polysilicon film, the third portion being at least a part of the second portion;

removing the sidewall template exposing a fourth portion of the polysilicon film, the fourth portion being at least a part of the first portion; and etching the third portion and the fourth portion of the polysilicon film thereby providing the polysilicon structure having a width of about 100 nm or less underlying the vertical portion of the silicon containing sidewall film.

9. The method of claim 8, wherein the sidewall template comprises at least one of a silicon containing material and a low K polymer material.

10. The method of claim 8, wherein the silicon containing sidewall film has a thickness from about 200 Å to about 1,500 Å.

11. The method of claim 8, wherein the silicon containing sidewall film comprises at least one of silicon nitride, silicon oxide and silicon oxynitride.

12. The method of claim 8, wherein directionally etching the silicon containing sidewall film involves using an anisotropic reactive ion etch.

13. The method of claim 8, further comprising processing the polysilicon structure into a polysilicon gate conductor.

14. The method of claim 8, wherein the polysilicon structure has a thickness of about 3,000 Å or less and a width of about 1,000 Å or less.

15. A method of forming a thin metal line, comprising:

providing a substrate having a metal layer thereon;

patterning a sidewall template over a first portion of the metal layer wherein a second portion of the metal layer is exposed, the sidewall template having at least one sidewall over the metal layer;

depositing a silicon containing sidewall film over the metal layer and the sidewall template, the silicon containing sidewall film having a vertical portion adjacent the sidewall of the sidewall template and a horizontal portion in areas not adjacent the sidewall of the sidewall template, the silicon containing sidewall film having a thickness from about 100 Å to about 2,000 Å;

removing the horizontal portion of the silicon containing sidewall film exposing a third portion of the metal layer, the third portion being at least a part of the second portion;

removing the sidewall template exposing a fourth portion of the metal layer, the fourth portion being at least a part of the first portion; and etching the third portion and the fourth portion of the metal layer thereby providing the thin metal line having a width of about 100 nm or less underlying the vertical portion of the silicon containing sidewall film.

16. The method of claim 15, wherein the metal layer has a thickness from about 500 Å to about 3,000 Å and comprises at least one of aluminum, copper, gold, nickel, palladium, platinum, silver, tantalum, titanium, tungsten, zinc, an aluminum-copper alloy, an aluminum alloy, a copper alloy, a titanium alloy, a tungsten alloy, a titanium-tungsten alloy, a gold alloy, a nickel alloy, a palladium alloy, a platinum alloy, a silver alloy, a tantalum alloy, and a zinc alloy.

17. The method of claim 15, wherein the silicon containing film comprises one of silicon nitride, silicon oxide, and silicon oxynitride.

18. The method of claim 15, wherein the sidewall template comprises at least one of a silicon containing material and a low K polymer material.

19. The method of claim 15, wherein directionally etching the silicon containing film involves using a dry anisotropic etch technique.

20. The method of claim 15, wherein the thin metal line has a thickness of about 2,700 Å or less and a width of about 1,000 Å or less.

* * * * *